United States Patent
Shih (10) Patent No.: US 6,664,149 B2
(45) Date of Patent: Dec. 16, 2003

(54) TFT-LCD FORMED WITH FOUR MASKING STEPS

(75) Inventor: Hsueh-Feng Shih, Taipei (TW)

(73) Assignee: Hannstar Display Corp., Taipei (TW)

( * ) Notice: Subject to any disclaimer, the term of this patent is extended or adjusted under 35 U.S.C. 154(b) by 0 days.

(21) Appl. No.: 10/270,806

(22) Filed: Oct. 15, 2002

(65) Prior Publication Data

US 2003/0134458 A1 Jul. 17, 2003

Related U.S. Application Data

(62) Division of application No. 10/073,795, filed on Feb. 11, 2002, now Pat. No. 6,509,614.

(30) Foreign Application Priority Data

Aug. 28, 2001 (TW) .......................................... 90121230 A (51) Int. Cl.⁷ .............................................. H01L 21/84
(52) U.S. Cl. ........................ 438/151; 438/155; 438/159
(58) Field of Search .............................. 438/149, 151, 438/154, 155, 158, 159, 164; 257/347, 350, 59, 30

(56) References Cited

U.S. PATENT DOCUMENTS

| 5,976,902 A | 11/1999 | Shih .............................. 257/59 |
| 6,316,295 B1 * | 11/2001 | Jang et al. ................... 438/151 |
| 6,338,989 B1 | 1/2002 | Ahn et al. .................... 438/155 |
| 6,436,740 B1 | 8/2002 | Jen et al. ..................... 438/149 |
| 6,448,116 B1 | 9/2002 | Wong .......................... 257/347 |
| 2002/0068372 A1 | 6/2002 | Kunii .......................... 438/30 |

* cited by examiner

Primary Examiner—Tuan H. Nguyen
(74) Attorney, Agent, or Firm—Volpe and Koenig, P.C.

(57) ABSTRACT

The present invention discloses a structure of a TFT-LCD and its forming process in order to reduce the number of masking steps for manufacturing the tri-layer structure of a TFT-LCD, and further provides a process for forming a TFT-LCD with four masking steps. In addition, the forming processes of a storage capacitor, a wiring pad and an electrostatic discharge structure are performed simultaneously with the forming process of a TFT-LCD.

16 Claims, 12 Drawing Sheets

TFT-LCD FORMED WITH FOUR MASKING STEPS

FIELD OF THE INVENTION

The present invention relates to a structure of a thin film transistor (TFT) and its forming process, and more particularly to a structure of a thin film transistor-liquid crystal display (TFT-LCD) and its forming process.

BACKGROUND OF THE INVENTION

Nowadays, for maturely developing structures of thin film transistor-liquid crystal displays (TFT-LCD), a tri-layer structure of a TFT-LCD becomes the main steam. Compared to a back channel etch (BCE) structure of a TFT-LCD of the last generation, a tri-layer structure additionally includes a top nitride over the semiconductor layer as an etch stopper so that the etching step for defining source/drain and channel regions can be well controlled. Accordingly, the thickness of the active layer can be made to be thinner in the tri-layer structure than in the BCE structure, which is advantageous for the stability of resulting devices and the performance in mass production. However, the provision of the additional etch stopper layer needs an additional masking step, thereby making the process for forming a tri-layer structure relatively complicated.

Figure 1A:
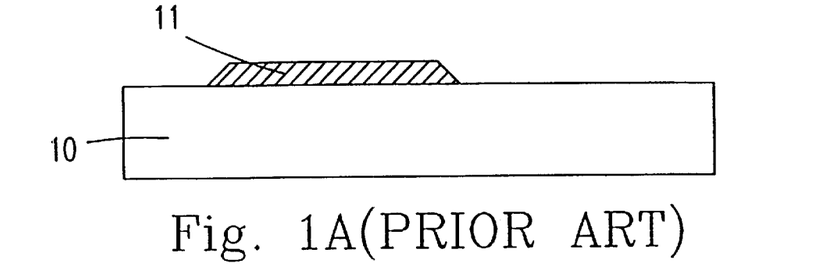
FIGS. 1A–1G are cross-sectional views illustrating the steps of forming a TFT-LCD by six mask and photolithography procedures according to the prior art.
Figure 1B:
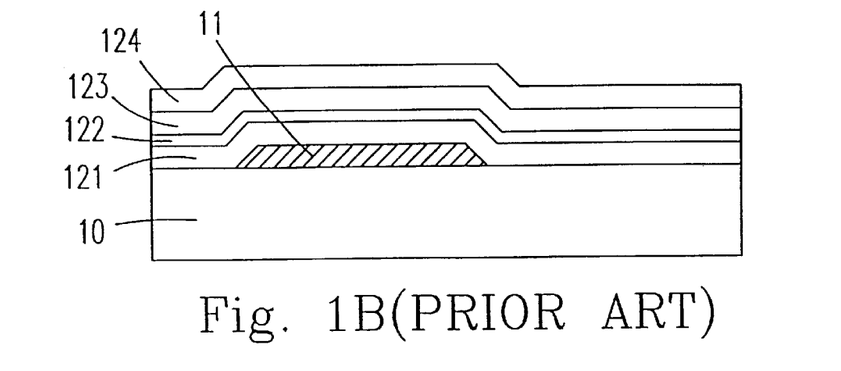
Figure 1C:
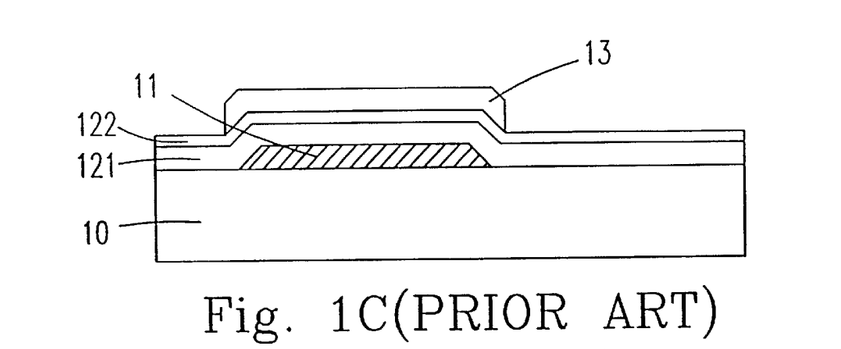
Figure 1D:
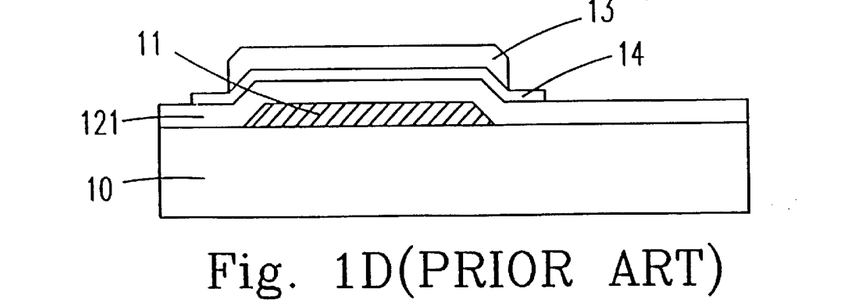
Figure 1E:
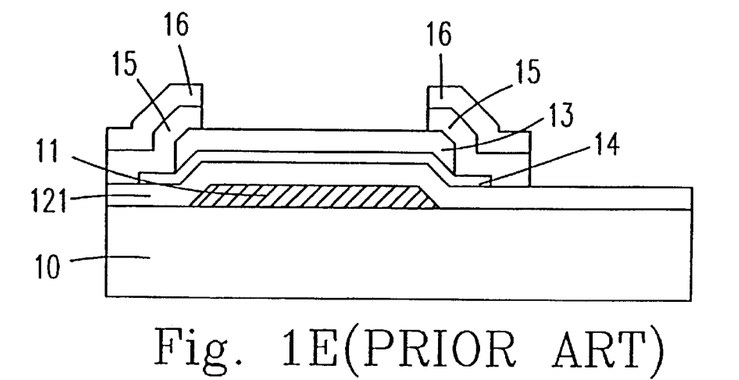
Figure 1F:
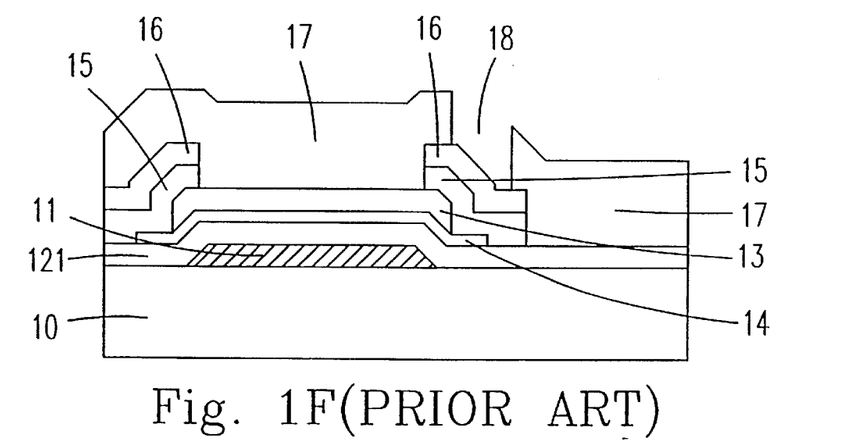
Figure 1G:
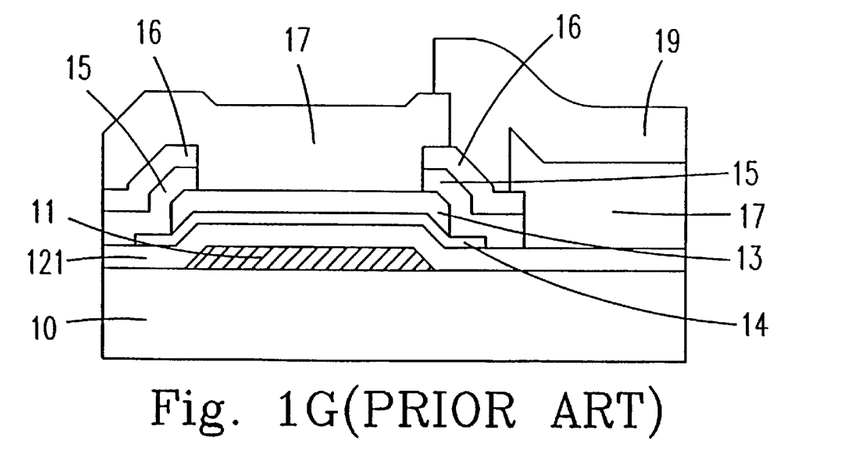

As for the tri-layer structure of a TFT-LCD, a conventional forming process with six masking steps is illustrated as follows with reference to FIGS. 1A–1G which are cross-sectional views of intermediate structures at different stages. The conventional forming process includes steps of:

i) forming a first conductive layer (made of chromium, tungsten molybdenum, tantalum, aluminum, or copper) on an insulating substrate 10, and using a first mask and photolithography procedure to etch the first conductive layer for defining a gate electrode 11, as shown in FIG. 1A;

ii) forming a tri-layer structure (usually formed of silicon nitride layer-intrinsic amorphous silicon layer-silicon nitride layer) including a gate insulation layer 121, a semiconductor layer 122 and an etch stopper layer 123, and a photoresist layer 124 on the resulting structure of FIG. 1A, as shown in FIG. 1B.

iii) using a second mask and photolithography procedure to etch the etch stopper layer 123 for defining an etch stopper 13, as shown in FIG. 1C;

iv) using a third mask and photolithography procedure to etch the semiconductor layer 122 for defining a channel region 14, as shown in FIG. 1D;

v) forming a doped semiconductor layer (usually made of amorphous silicon) and a data and connection lines layer (usually made of a chromium/aluminum or a molybdenum/aluminum/molybdenum composite metal layers) on the resulting structure of FIG. 1D, and using a fourth mask and photolithography procedure to etch the doped semiconductor layer and the data and connection lines layer for defining a source/drain region 15 and a data and connection lines region 16, as shown in FIG. 1E;

vi) forming a passivation layer 17 (usually made of silicon nitride) on the resulting structure of FIG. 1E, and using a fifth mask and photolithography procedure to etch the passivation layer for defining tape automated bonding (TAB) openings (not shown), and a contact window 18, as shown in FIG. 1F; and vii) forming a transparent electrode layer (usually made of indium tin oxide) on the resulting structure of FIG. 1F, and using a sixth mask and photolithography procedure to etch the transparent electrode layer for defining a pixel electrode 19, as shown in FIG. 1G.

However, the conventional process for forming the tri-layer structure of a TFT-LCD with six masking steps is too complicated.

As known, the number of mask and photolithography procedures directly affects not only the production cost but also the manufacturing time. Moreover, for each mask and photolithography procedure, the risks of mis-alignment and particulate contamination may be involved so as to affect the production yield. Therefore, the major object of the present invention is to solve the drawbacks of prior art, and further provide a forming process with reduced mask and photolithography procedures.

SUMMARY OF THE INVENTION

It is an object of the present invention to provide a process for forming a TFT-LCD with reduced mask and photolithography procedures.

It is another object of the present invention to provide a structure of a TFT-LCD with reduced mask and photolithography procedures.

In accordance with an aspect of the present invention, the process for forming a TFT-LCD includes steps of: providing an insulating substrate; forming a transparent electrode layer, a first conductive layer and a first photoresist layer on the insulating substrate; using a first mask and photolithography procedure to etch the transparent electrode layer and the first conductive layer for defining a transparent electrode and a gate electrode, and removing the first photoresist layer; forming an insulation layer, a semiconductor layer, an etch stopper layer and a second photoresist layer on the insulating substrate and the gate electrode, and using a second mask and photolithography procedure to etch the etch stopper layer and the semiconductor layer for defining an etch stopper and a channel region; forming a doped semiconductor layer and a data and connection lines layer, removing the second photoresist layer, and forming a third photoresist layer above the insulating substrate; using a third mask and photolithography procedure to etch the data and connection lines layer, the doped semiconductor layer and the insulation layer for defining a data and connection lines region, a source/drain region and a gate insulating region; forming a second conductive layer above the insulating substrate, and removing the third photoresist layer for defining a conductive region; and forming a passivation layer and a fourth photoresist layer above the insulating substrate, using a fourth mask and photolithography procedure to etch the passivation layer, the conductive region and the gate electrode for defining a passivation region and a pixel electrode, and removing the fourth photoresist layer.

Preferably, the insulating substrate is made of a light-transmitting material.

Preferably, the light-transmitting material is glass.

Preferably, the conductive layer is made of chromium, molybdenum, tantalum, tantalum molybdenum, tungsten molybdenum, aluminum, aluminum silicon, copper or the mixture thereof.

Preferably, the insulation layer is made of silicon nitride, silicon oxide, silicon oxynitride, tantalum oxide, aluminum oxide or the mixture thereof.

Preferably, the etch stopper layer is made of silicon nitride, silicon oxide or silicon oxynitride.

Preferably, the semiconductor layer is made of intrinsic amorphous silicon, micro-crystalline silicon or polysilicon.

Preferably, the doped semiconductor layer is made of highly doped amorphous silicon, highly doped micro-crystalline silicon or highly doped polysilicon.

Preferably, the transparent electrode layer is made of indium tin oxide or indium lead oxide.

Preferably, the data and connection lines layer is made of a chromium/aluminum or a molybdenum/aluminum/molybdenum composite metal layers.

Preferably, the passivation layer is made of silicon nitride or silicon oxynitride.

According to the process for forming a TFT-LCD described above, a process for forming a storage capacitor is performed simultaneously, which includes steps of: using the first mask and photolithography procedure to etch the transparent electrode layer and the first conductive layer for defining a lower electrode of the storage capacitor; using the third mask and photolithography procedure to etch the data and connection lines layer, the doped semiconductor layer and the insulation layer for defining an upper electrode and an insulating region of the storage capacitor; and using the fourth mask and photolithography procedure to etch the passivation layer, the conductive region and the gate electrode for defining a passivation region of the storage capacitor.

Preferably, the storage capacitor is made of metal-insulator-metal or metal-insulator-silicon.

According to the process for forming a TFT-LCD described above, a process for forming a wiring pad is performed simultaneously, which includes steps of: using said first mask and photolithography procedure to etch said transparent electrode layer and said first conductive layer for defining a first configuration of said wiring pad; using said third mask and photolithography procedure to etch said data and connection lines layer, said doped semiconductor layer and said insulation layer for defining a second configuration of said wiring pad; and using said fourth mask and photolithography procedure to etch said passivation layer, said conductive region and said gate electrode for defining a passivation region and an opening of said-wiring pad.

According to the process for forming a TFT-LCD described above, a process for forming an electrostatic discharge structure is performed simultaneously, which includes steps of: using said first mask and photolithography procedure to etch said transparent electrode layer and said first conductive layer for defining a third configuration of said electrostatic discharge structure; using said third mask and photolithography procedure to etch said data and connection lines layer, said doped semiconductor layer and said insulation layer for defining a fourth configuration of said electrostatic discharge structure; and using said fourth mask and photolithography procedure to etch said passivation layer, said conductive region and said gate electrode for defining a passivation region of said electrostatic discharge structure.

In accordance with another aspect of the present invention, a structure of a TFT-LCD includes an insulating substrate, a transparent electrode, a pixel electrode, a gate electrode, a gate insulating electrode region, a channel region, an etch stopper, a source/drain region, a data and connection lines region, a conductive region and a passivation region. The transparent electrode and the pixel electrode are formed on the insulating substrate. The gate electrode is formed on the transparent electrode. The gate insulating region is formed on the insulating substrate and the gate electrode, and covers a portion of the pixel electrode. The channel region is formed on the gate insulating region and is conforming to position and size of the gate electrode. The etch stopper is formed on the channel region. The source/drain region is formed on both sides of the channel region and the etch stopper, and on the gate insulating region which is not covered by the channel region and the etch stopper. The data and connection lines region is formed on the gate insulating region with the source/drain region. The conductive region is formed on both sides of the data and connection lines region, the source/drain region and the gate insulating region. The passivation region is formed on the etch stopper, the data and connection lines region and the conductive region.

Preferably, the insulating substrate is made of a light-transmitting material.

Preferably, the light-transmitting material is glass.

Preferably, the conductive layer is made of chromium, molybdenum, tantalum, tantalum molybdenum, tungsten molybdenum, aluminum, aluminum silicon, copper or the mixture thereof.

Preferably, the insulation layer is made of silicon nitride, silicon oxide, silicon oxynitride, tantalum oxide, aluminum oxide or the mixture thereof.

Preferably, the etch stopper layer is made of silicon nitride, silicon oxide or silicon oxynitride.

Preferably, the semiconductor layer is made of intrinsic amorphous silicon, micro-crystalline silicon or polysilicon.

Preferably, the doped semiconductor layer is made of highly doped amorphous silicon, highly doped micro-crystalline silicon or highly doped polysilicon.

Preferably, the transparent electrode layer is made of indium tin oxide or indium lead oxide.

Preferably, the data and connection lines layer is made of a chromium/aluminum or a molybdenum/aluminum/molybdenum composite metal layers.

Preferably, the passivation layer is made of silicon nitride or silicon oxynitride.

The above objects and advantages of the present invention will become more readily apparent to those ordinarily skilled in the art after reviewing the following detailed descriptions and accompanying drawings, in which:

BRIEF DESCRIPTION OF THE DRAWINGS

FIGS. 2A1–3, 2B1–4, 2C1–4 and 2D1–2 are cross-sectional views illustrating the steps of forming a TFT-LCD, a storage capacitor and a wiring pad according to the preferred embodiment of the present invention; and FIGS. 3A, 3B, 3C1–4 and 3D1–2 are cross-sectional views illustrating the steps of forming an electrostatic discharge structure according to the preferred embodiment of the present invention.

DETAILED DESCRIPTION OF THE PREFERRED EMBODIMENT

Please refer to FIGS. 2A1–3. For forming a thin film transistor 1, a transparent electrode layer 21 (250–1000 Å in thickness), a first conductive layer 22 (1000–5000 Å in thickness) and a first photoresist layer 23 are formed sequentially on a light-transmitting insulating substrate 20. Then a first mask and photolithography procedure is performed to define a transparent electrode 211 and a gate electrode 221, and the first photoresist layer 23 is removed. As shown in FIG. 2B1, a tri-layer structure (usually formed of silicon nitride layer, intrinsic amorphous silicon layer and silicon nitride layer) including (1) a gate insulation layer (1000–5000 Å in thickness and usually made of silicon nitride or silicon nitride/silicon oxide) which contains sublayers of a first insulation layer 241 and a second insulation layer 242 made of different materials, (2) a semiconductor layer 25 (100–1000 Å in thickness) and (3) an etch stopper layer 26 (1000–5000 Å in thickness), and a second photoresist layer 27 are formed sequentially on the insulating substrate 20 and the gate electrode 221. Using the second photoresist layer 27 and the gate electrode 221 as masks respectively, and exposing the second photoresist layer 27 through the insulating substrate 20 from top to bottom and from bottom to top simultaneously, the etch stopper layer 26, the semiconductor layer 25 and the second insulation layer 242 are etched by a second mask and photolithography procedure to define an etch stopper 261, a channel region 251 and a second insulation region 2421 (as shown in FIG. 2B2).

As shown in FIG. 2B3, a doped semiconductor layer 28 (100–1000 Å in thickness) and a data and connection lines layer 29 (1000–5000 Å in thickness) are formed sequentially above the insulating substrate 20, and then the second photoresist layer 27 is removed (as shown in FIG. 2B4) and a third photoresist layer 30 is formed above the insulating substrate 20 (as shown in FIG. 2C1). The data and connection lines layer 29, the doped semiconductor layer 28 and the first insulation layer 241 are etched by a third mask and photolithography procedure to define a data and connection lines region 291, a source/drain region 281 and a gate insulating region 2411 (as shown in FIG. 2C2). As shown in FIG. 2C3, a second conductive layer 31 is formed above the insulating substrate 20, and then the third photoresist layer 30 is removed (as shown in FIG. 2C4) to define a conductive region 311.

Figure 2A:
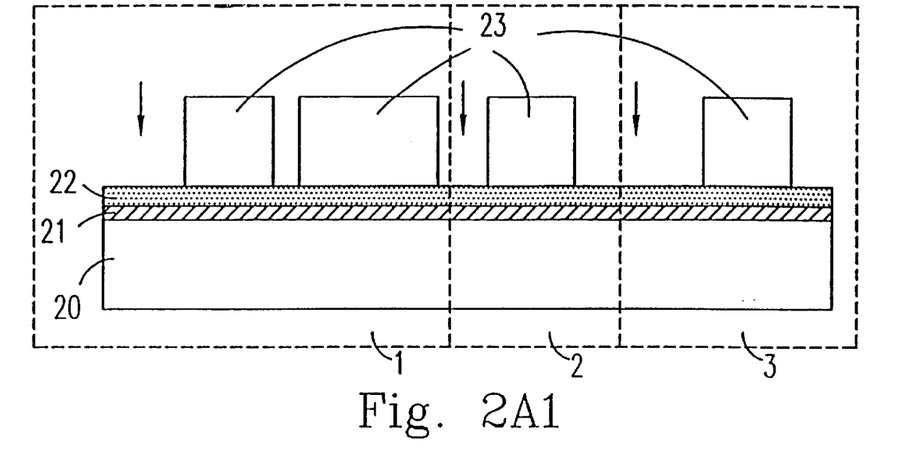
Figure 2A:
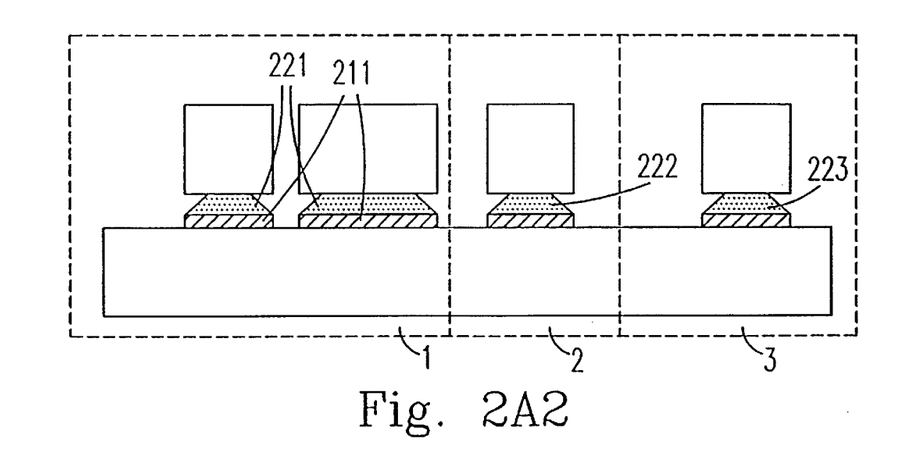
Figure 2A:
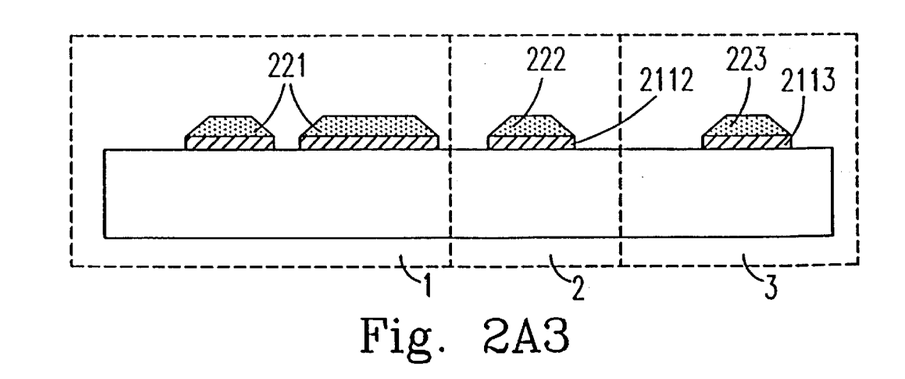
Figure 2B:
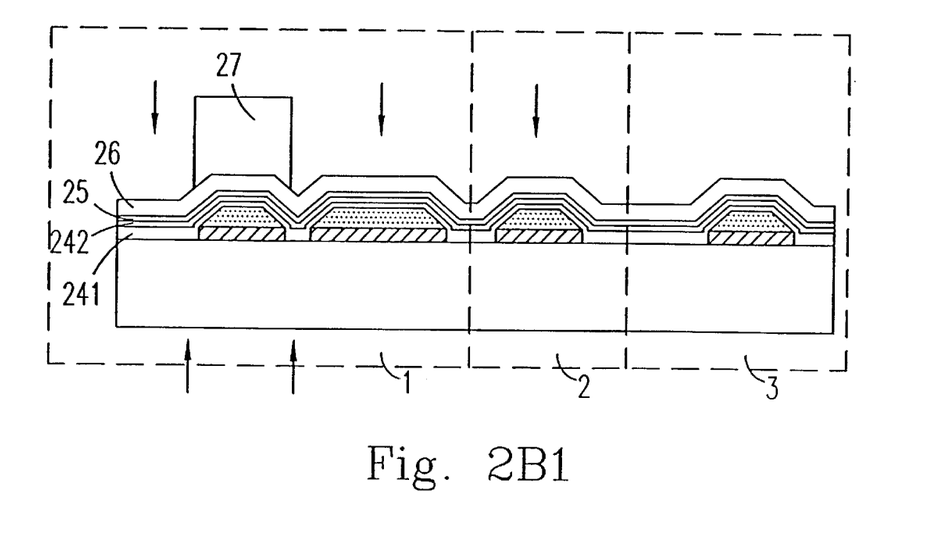
Figure 2B:
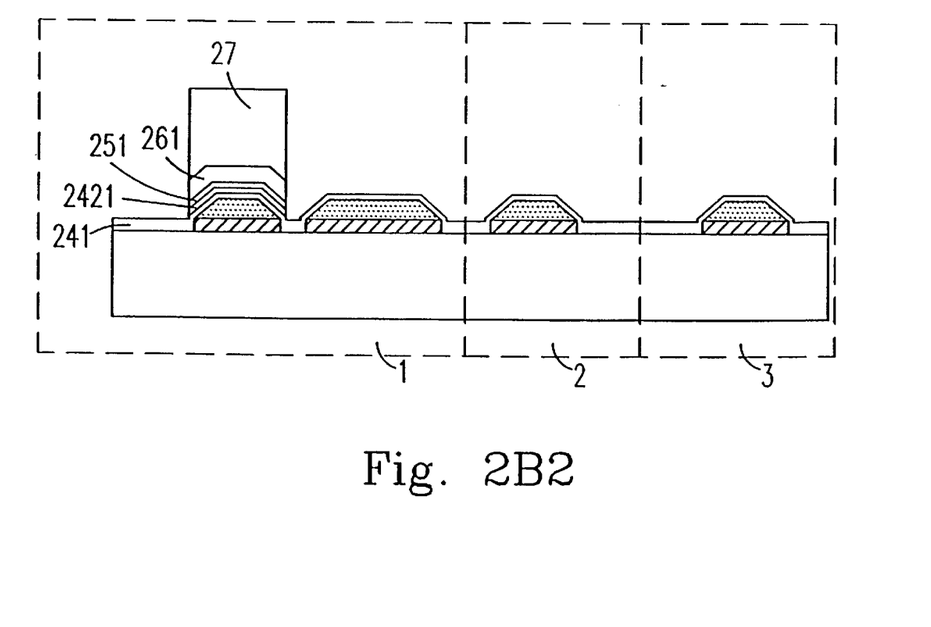
Figure 2B:
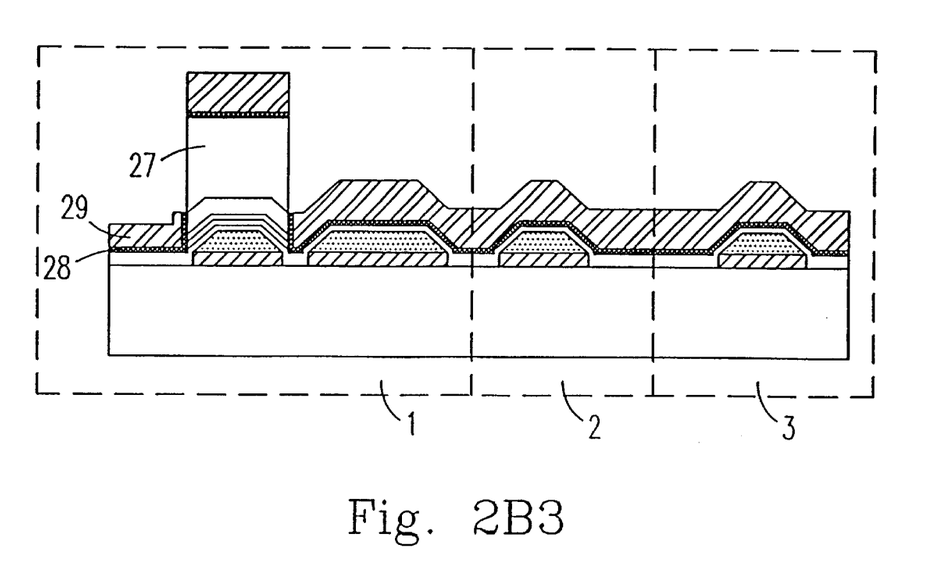
Figure 2B:
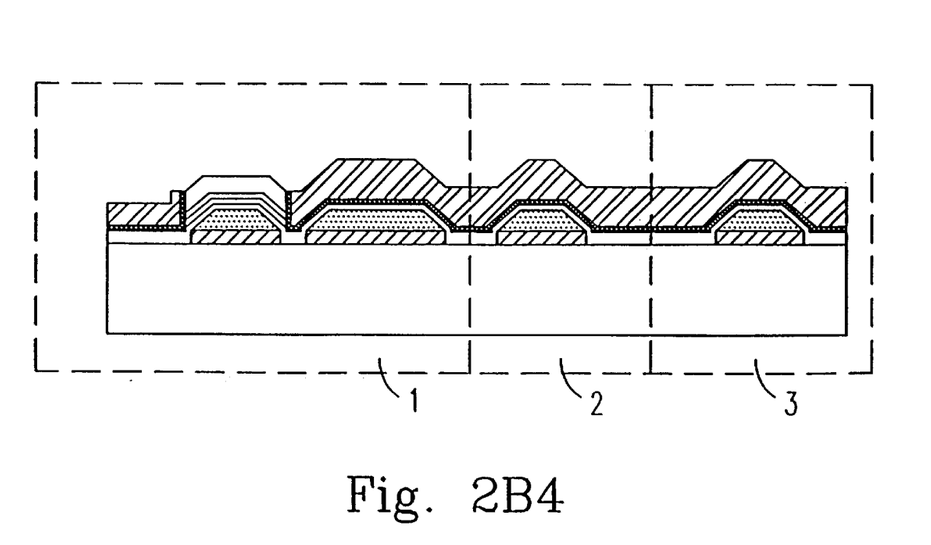
Figure 2C:
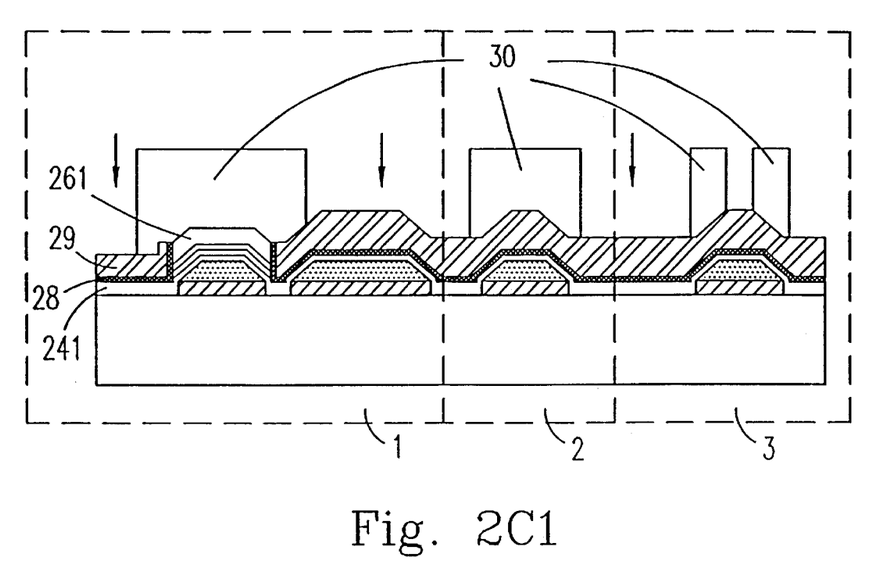
Figure 2C:
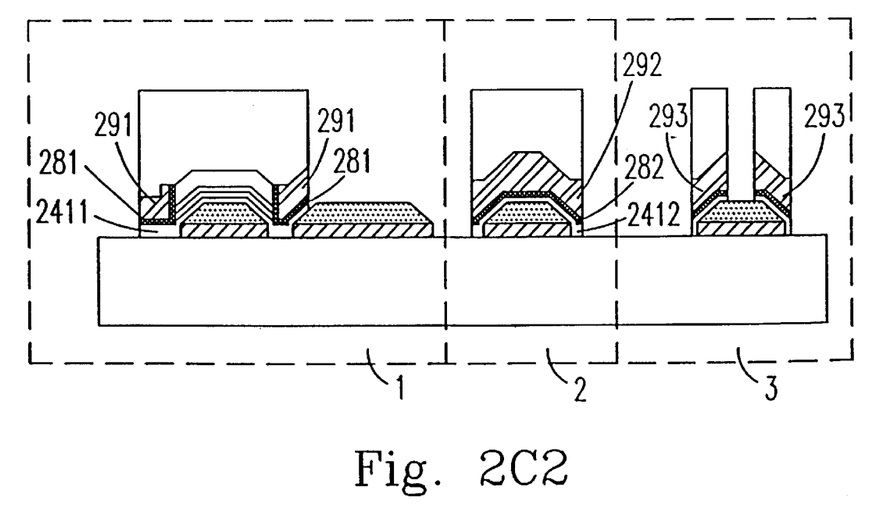
Figure 2C:
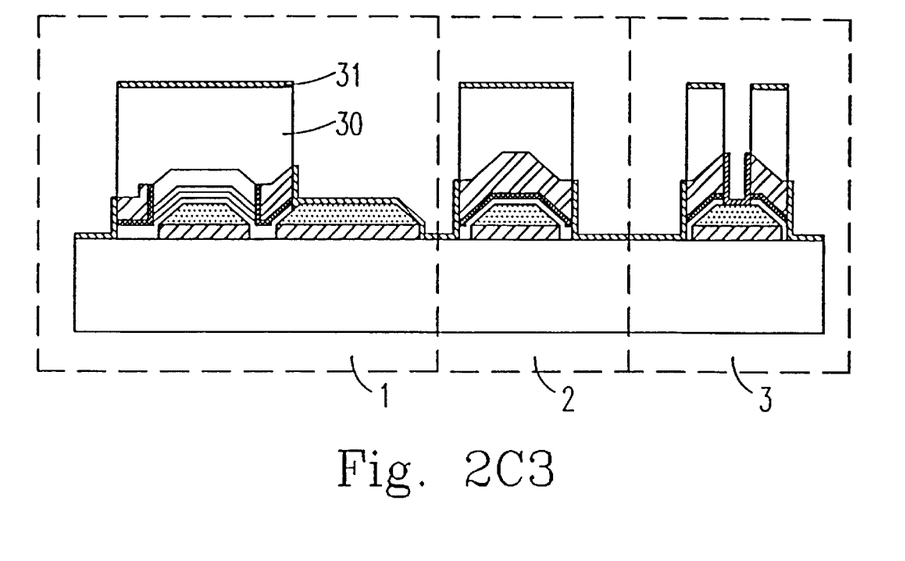
Figure 2C:
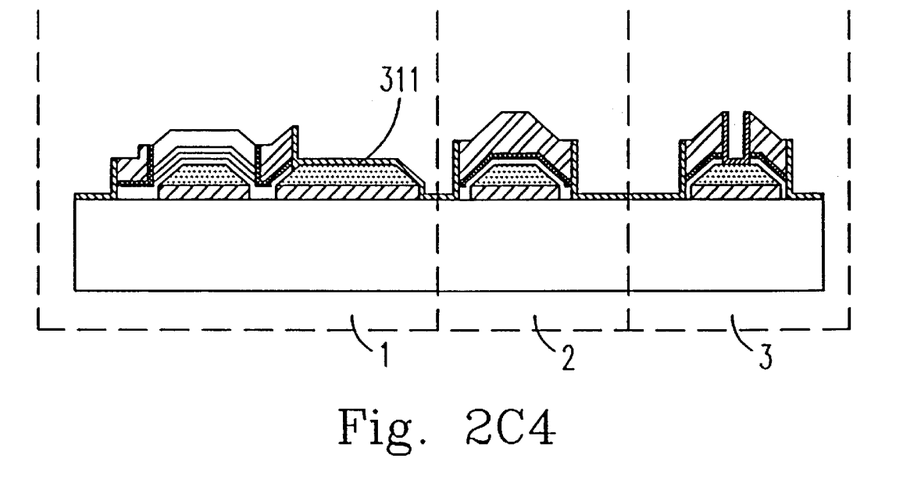
Figure 2D:
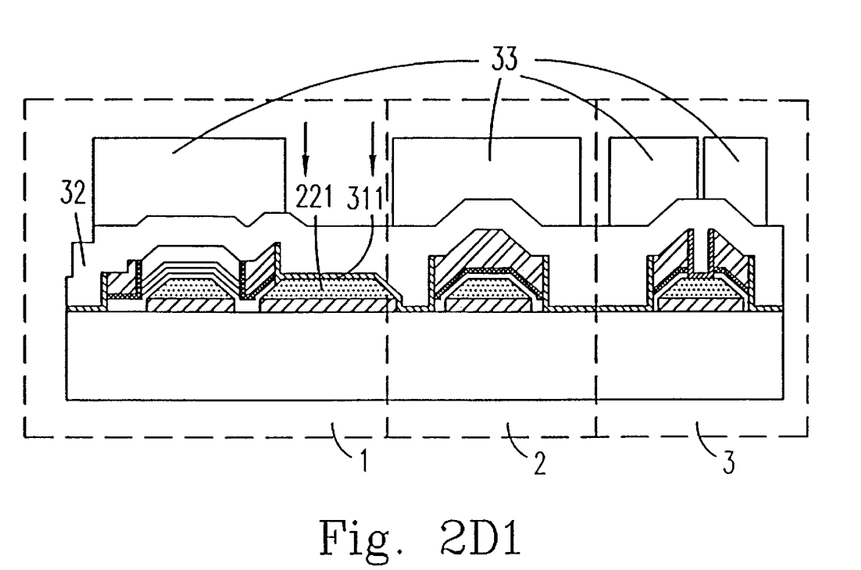
Figure 2D:
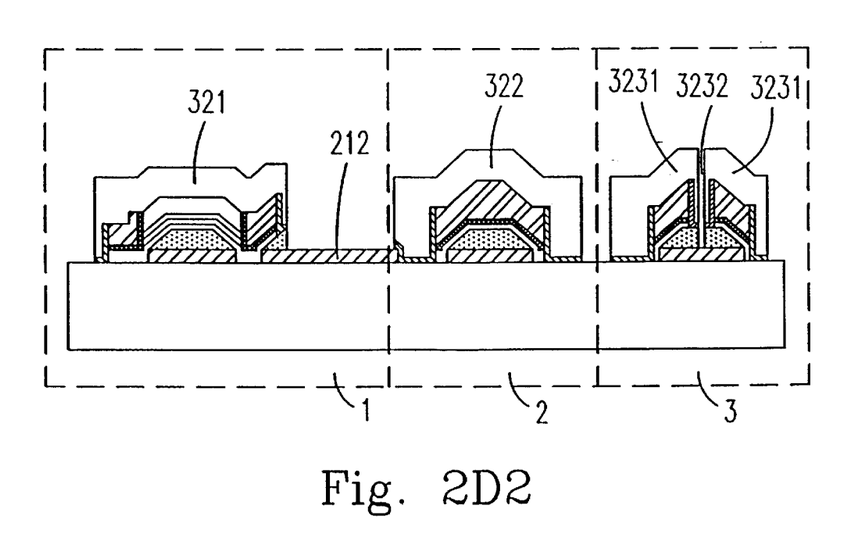

As shown in FIG. 2D1, a passivation layer 32 (1000–4000 Å in thickness) and a fourth photoresist layer 33 are formed sequentially above the insulating substrate 20. Then the passivation layer 32, the conductive region 311 and the gate electrode 221 are etched by a fourth mask and photolithography procedure to define a passivation region 321 and a pixel electrode 212, and the fourth photoresist layer 33 is removed (as shown in FIG. 2D2).

It is an advantage of the present invention that a process for forming a storage capacitor 2 is performed simultaneously with the forming process of the thin film transistor 1. As shown in FIG. 2A2, the transparent electrode layer 21 and the first conductive layer 22 are etched by the first mask and photolithography procedure to define a lower electrode 222 of the storage capacitor 2. As shown in FIG. 2C1, the data and connection lines layer 29, the doped semiconductor layer 28 and the first insulation layer 241 are etched by the third mask and photolithography procedure to define an upper electrode 292 and an insulating region 282 and 2412 of the storage capacitor 2 (as shown in FIG. 2C2). As shown in FIG. 2D1, the passivation layer 32, the conductive region 311 and the gate electrode 221 are etched by the fourth mask and photolithography procedure to define a passivation region 322 of the storage capacitor 2 (as shown in FIG. 2D2).

It is further an advantage of the present invention that a process for forming a wiring pad 3 is performed simultaneously with the forming process of the thin film transistor 1. As shown in FIG. 2A2, the transparent electrode layer 21 and the first conductive layer 22 are etched by the first mask and photolithography procedure to define a first configuration including regions 223 and 2113 of the wiring pad 3. As shown in FIG. 2C1, the data and connection lines layer 29, the doped semiconductor layer 28 and the first insulation layer 241 are etched by the third mask and photolithography procedure to define a second configuration 293 of the wiring pad 3 (as shown in FIG. 2C2). As shown in FIG. 2D1, the passivation layer 32, the conductive region 311 and the gate electrode 221 are etched by the fourth mask and photolithography procedure to define a passivation region 3231 and an opening 3232 of the wiring pad 3 (as shown in FIG. 2D2).

Figure 3A:
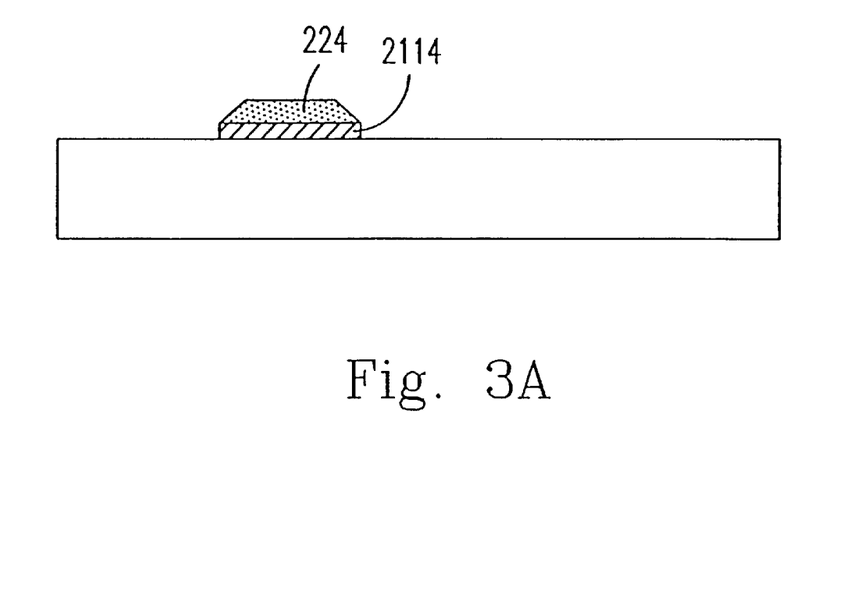
Figure 3B:
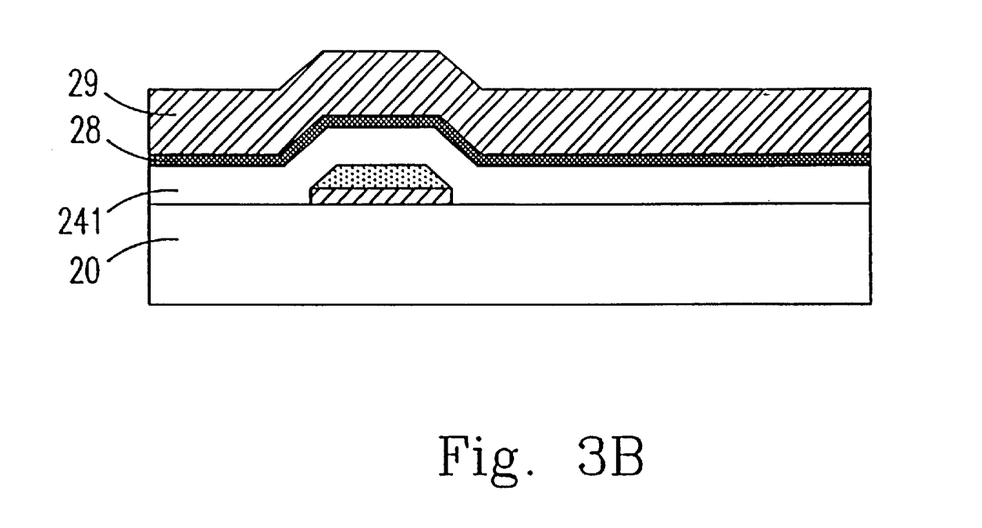
Figure 3C:
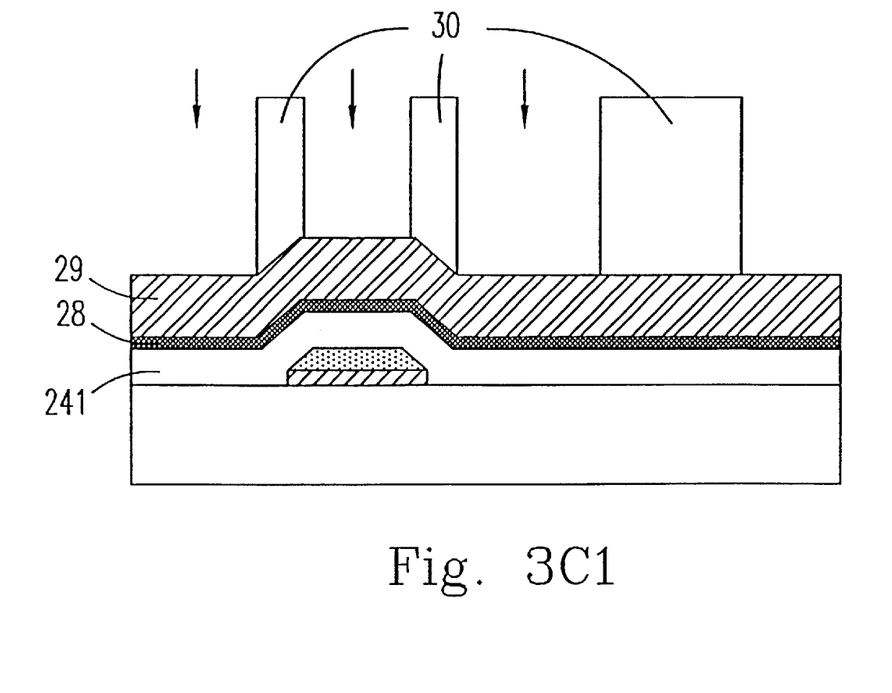
Figure 3C:
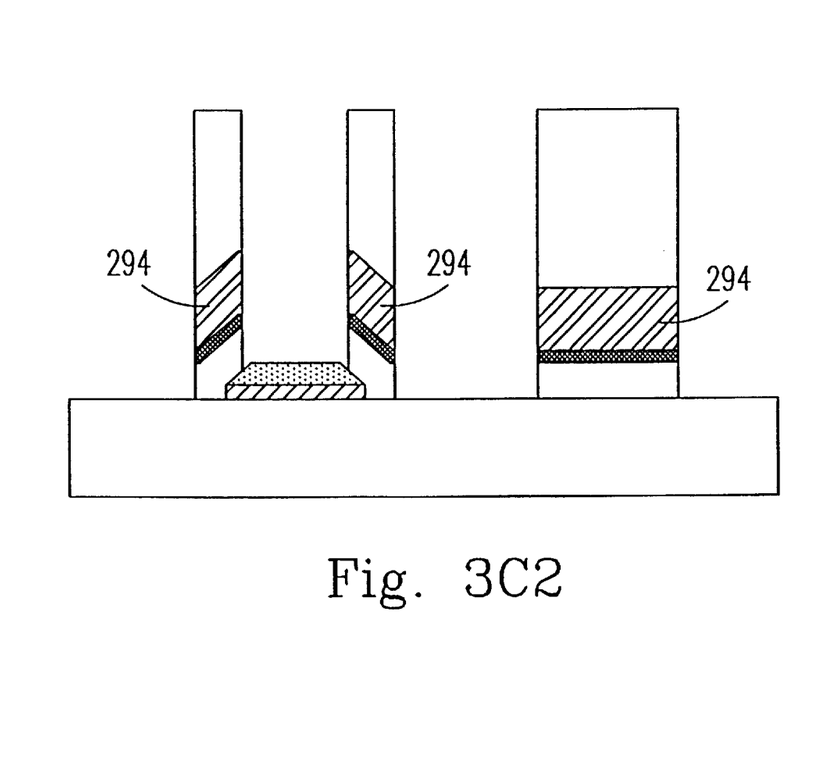
Figure 3C:
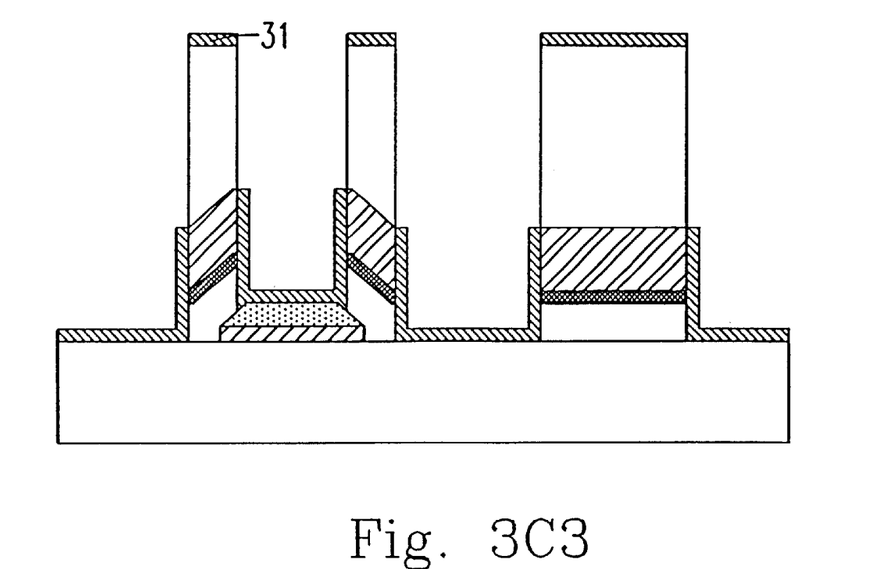
Figure 3C:
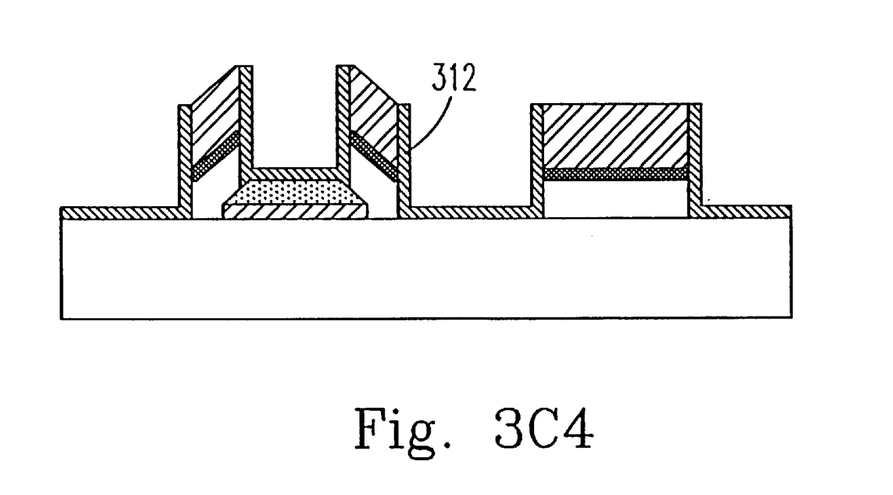
Figure 3D:
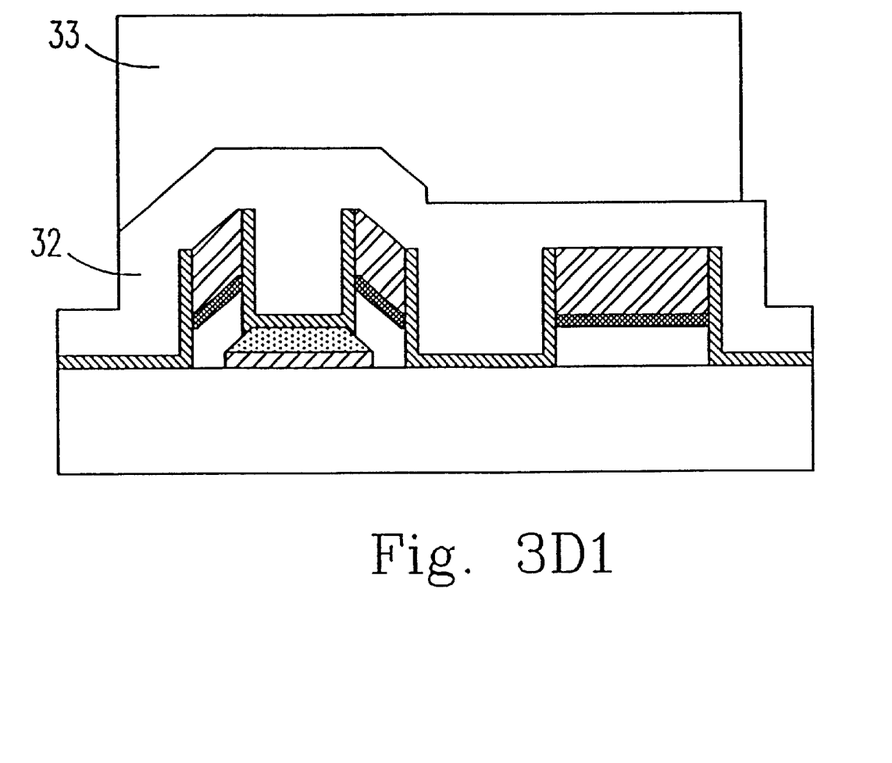
Figure 3D:
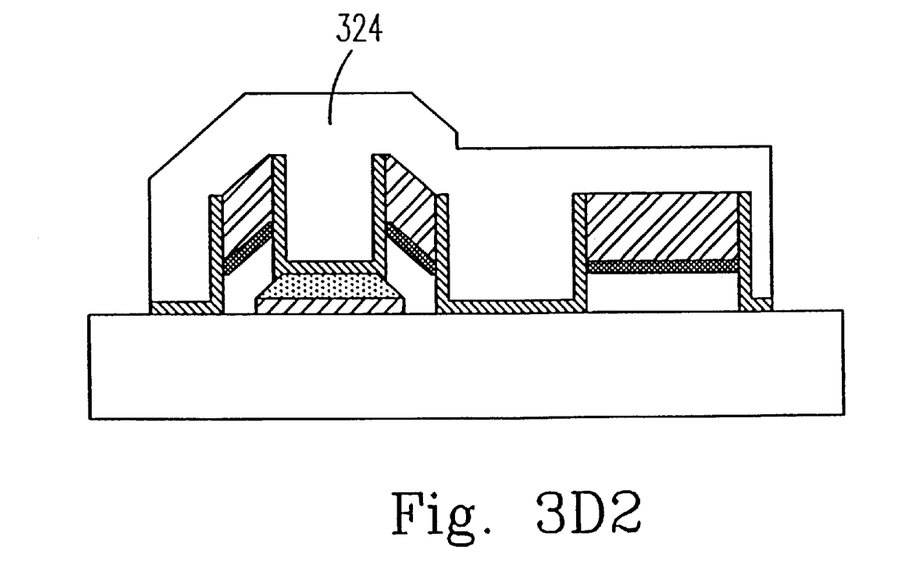

It is another advantage of the present invention that a process for forming an electrostatic discharge structure is performed simultaneously with the forming process of the thin film transistor. As shown in FIG. 3A (corresponding to FIG. 2A3), the transparent electrode layer 21 and the first conductive layer 22 are etched by the first mask and photolithography procedure to define a third configuration including regions 224 and 2114 of the electrostatic discharge structure. As shown in FIG. 3B (corresponding to FIG. 2B3), the doped semiconductor layer 28 (100–1000 Å in thickness) and the data and connection lines layer 29 (1000–5000 Å in thickness) are formed sequentially above the insulating substrate 20. As shown in FIG. 3C1 (corresponding to FIG. 2C1), the data and connection lines layer 29, the doped semiconductor layer 28 and the first insulation layer 241 are etched by the third mask and photolithography procedure to define a fourth configuration 294 of the electrostatic discharge structure (as shown in FIG. 3C2, which is corresponding to FIG. 2C2). As shown in FIG. 3C3 (corresponding to FIG. 2C3), a second conductive layer 31 is formed above the insulating substrate 20, and then the third photoresist layer 30 is removed to define a conductive region 312 of the electrostatic discharge structure (as shown in FIG. 3C4, which is corresponding to FIG. 2C4). Finally, as shown in FIG. 3D1 (corresponding to FIG. 2D1), the passivation layer 32 and the conductive region 311 are etched by the fourth mask and photolithography procedure to define a passivation region 324 of the electrostatic discharge structure (as shown in FIG. 3D2, which is corresponding to FIG. 2D2).

In above-mentioned preferred embodiments, the insulating substrate is made of light-transmitting glass, and the conductive layer is made of a material selected from a group consisting of chromium, molybdenum, tantalum, tantalum molybdenum, tungsten molybdenum, aluminum, aluminum silicon, copper and the mixture thereof. As for the tri-layer structure formed of the gate insulation layer, the semiconductor layer and the etch stopper layer, the gate insulation layer is made of a material selected from a group consisting of silicon nitride, silicon oxide, silicon oxynitride, tantalum oxide, aluminum oxide and the mixture thereof, and the etch stopper layer is made of a material selected from a group consisting of silicon nitride, silicon oxide and silicon oxynitride, and then the semiconductor layer is made of a material selected from a group consisting of intrinsic amorphous silicon, micro-crystalline silicon and polysilicon. The transparent electrode layer is made of indium tin oxide or indium lead oxide. The data and connection lines layer is made of a chromium/aluminum or a molybdenum/aluminum/molybdenum composite metal layers. The passivation layer is made of silicon nitride (mostly) or silicon oxynitride.

In conclusion, the preferred embodiments of the present invention disclose a forming process with reduced mask and photolithography procedures than those of prior art. Therefore, not only the production cost can be decreased effectively, but the manufacturing time can also be shortened. The risks of mis-alignments and particulate contaminations can be decreased simultaneously. Consequently, the present invention apparently solves the drawbacks of prior art, and provides a forming process with reduced mask and photolithography procedures for achieving the major objects of the present invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for forming a thin film transistor-liquid crystal display (TFT-LCD), comprising steps of:
   providing an insulating substrate;
   forming a transparent electrode layer, a first conductive layer and a first photoresist layer on said insulating substrate;
   using a first mask and photolithography procedure to etch said transparent electrode layer and said first conductive layer for defining a transparent electrode and a gate electrode, and removing said first photoresist layer;
   forming an insulation layer, a semiconductor layer, an etch stopper layer and a second photoresist layer on said insulating substrate and said gate electrode, and using a second mask and photolithography procedure to etch said etch stopper layer and said semiconductor layer for defining an etch stopper and a channel region;
   forming a doped semiconductor layer and a data and connection lines layer, removing said second photoresist layer, and forming a third photoresist layer above said insulating substrate;
   using a third mask and photolithography procedure to etch said data and connection lines layer, said doped semiconductor layer and said insulation layer for defining a data and connection lines region, a source/drain region and a gate insulating region;
   forming a second conductive layer above said insulating substrate, and removing said third photoresist layer for defining a conductive region; and
   forming a passivation layer and a fourth photoresist layer above said insulating substrate, using a fourth mask and photolithography procedure to etch said passivation layer, said conductive region and said gate electrode for defining a passivation region and a pixel electrode, and removing said fourth photoresist layer.

2. The process according to claim 1, wherein said insulating substrate is made of a light-transmitting material.

3. The process according to claim 2, wherein said light-transmitting material is glass.

4. The process according to claim 1, wherein said conductive layer is made of a material selected from a group consisting of chromium, molybdenum, tantalum, tantalum molybdenum, tungsten molybdenum, aluminum, aluminum silicon, copper and the mixture thereof.

5. The process according to claim 1, wherein said insulation layer is made of a material selected from a group consisting of silicon nitride, silicon oxide, silicon oxynitride, tantalum oxide, aluminum oxide and the mixture thereof.

6. The process according to claim 1, wherein said etch stopper layer is made of a material selected from a group consisting of silicon nitride, silicon oxide and silicon oxynitride.

7. The process according to claim 1, wherein said semiconductor layer is made of a material selected from a group consisting of intrinsic amorphous silicon, micro-crystalline silicon and polysilicon.

8. The process according to claim 1, wherein said doped semiconductor layer is made of a material selected from a group consisting of highly doped amorphous silicon, highly doped micro-crystalline silicon and highly doped polysilicon.

9. The process according to claim 1, wherein the material of said transparent electrode layer is one of indium tin oxide and indium lead oxide.

10. The process according to claim 1, wherein said data and connection lines layer is one of a chromium/aluminum and a molybdenum/aluminum/molybdenum composite metal layers.

11. The process according to claim 1, wherein the material of said passivation layer is one of silicon nitride and silicon oxynitride.

12. The process according to claim 1, wherein a process for forming a storage capacitor is performed simultaneously, which comprises steps of:
   using said first mask and photolithography procedure to etch said transparent electrode layer and said first conductive layer for defining a lower electrode of said storage capacitor;
   using said third mask and photolithography procedure to etch said data and connection lines layer, said doped semiconductor layer and said insulation layer for defining an upper electrode and an insulating region of said storage capacitor; and
   using said fourth mask and photolithography procedure to etch said passivation layer, said conductive region and said gate electrode for defining a passivation region of said storage capacitor.

13. The process according to claim 12, wherein said storage capacitor is made of metal-insulator-metal.

14. The process according to claim 12, wherein said storage capacitor is made of metal-insulator-silicon.

15. The process according to claim 1, wherein a process for forming a wiring pad is performed simultaneously, which comprises steps of:
   using said first mask and photolithography procedure to etch said transparent electrode layer and said first conductive layer for defining a first configuration of said wiring pad;
   using said third mask and photolithography procedure to etch said data and connection lines layer, said doped semiconductor layer and said insulation layer for defining a second configuration of said wiring pad; and
   using said fourth mask and photolithography procedure to etch said passivation layer, said conductive region and said gate electrode for defining a passivation region and an opening of said wiring pad.

16. The process according to claim 1, wherein a process for forming an electrostatic discharge structure is performed simultaneously, which comprises steps of:
   using said first mask and photolithography procedure to etch said transparent electrode layer and said first conductive layer for defining a third configuration of said electrostatic discharge structure;
   using said third mask and photolithography procedure to etch said data and connection lines layer, said doped semiconductor layer and said insulation layer for defining a fourth configuration of said electrostatic discharge structure; and
   using said fourth mask and photolithography procedure to etch said passivation layer, said conductive region and said gate electrode for defining a passivation region of said electrostatic discharge structure.

* * * * *